(12) United States Patent
Oba et al.

(10) Patent No.: US 7,504,885 B2
(45) Date of Patent: Mar. 17, 2009

(54) VARIABLE GAIN AMPLIFIER

(75) Inventors: Yasuo Oba, Shiga (JP); Takatoshi Kawai, Shizuoka (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 11/733,645

(22) Filed: Apr. 10, 2007

(65) Prior Publication Data
US 2007/0176683 A1   Aug. 2, 2007

(30) Foreign Application Priority Data
Apr. 12, 2006  (JP)  ............................. 2006-109406

(51) Int. Cl.
*H03G 3/10*  (2006.01)
(52) U.S. Cl. ....................... 330/284; 330/278
(58) Field of Classification Search ............... 330/69, 330/124 R, 254, 278, 284, 286, 295
See application file for complete search history.

(56) References Cited
U.S. PATENT DOCUMENTS
5,077,541 A * 12/1991 Gilbert ..................... 330/284
6,710,659 B2  3/2004 Teramoto et al.
7,250,814 B2 * 7/2007 Bardsley et al. .......... 330/124 R FOREIGN PATENT DOCUMENTS
| EP | 1524769 | 4/2005 |
|---|---|---|
| JP | 2003 60457 | 2/2003 |
| JP | 2005 117469 | 4/2005 |

* cited by examiner

Primary Examiner—Khanh V Nguyen
(74) Attorney, Agent, or Firm—Dickinson Wright, PLLC

(57) ABSTRACT

A variable gain amplifier of the present invention connects an input and an output of a first variable gain amplifier circuit to an RF input terminal and an RF output terminal, respectively, connects one terminal of an attenuation circuit is to an RF input terminal, connects an input and an output of a second variable gain amplifier circuit to the other terminal of the attenuation circuit and an RF output terminal, respectively, connects one terminal of the variable resistance circuit to a node between the attenuation circuit and the second variable gain amplifier circuit, and grounds the other terminal of the variable resistance circuit. A gain of the first variable gain amplifier circuit, a gain of the second variable gain amplifier circuit, and a resistance value of the variable resistance circuit are then varied by a gain control voltage outputted from a gain control section.

10 Claims, 12 Drawing Sheets

G1 GAIN OF VARIABLE GAIN AMPLIFIER CIRCUIT 2

G2 GAIN OF (VARIABLE RESISTANCE CIRCUIT 10) TO VARIABLE GAIN AMPLIFIER CIRCUIT 2

G3 GAIN OF (VARIABLE RESISTANCE CIRCUIT 10) THROUGH ATTENUATION CIRCUIT 3
THROUGH (VARIABLE RESISTANCE CIRCUIT 4) TO VARIABLE GAIN AMPLIFIER CIRCUIT 5

G4 GAIN OF VARIABLE GAIN AMPLIFIER 13

G1 GAIN OF VARIABLE GAIN AMPLIFIER CIRCUIT 2
G2 GAIN OF ATTENUATION CIRCUIT 3 THROUGH
    (VARIABLE RESISTANCE CIRCUIT 4) TO VARIABLE GAIN AMPLIFIER CIRCUIT 5
G3 GAIN OF VARIABLE GAIN AMPLIFIER 9

G3' G1+G2
G4 GAIN OF VARIABLE GAIN AMPLIFIER 13

G1  GAIN OF FIRST VARIABLE GAIN AMPLIFIER CIRCUIT 102

G2  GAIN OF FIRST ATTENUATION CIRCUIT 103 TO SECOND VARIABLE GAIN AMPLIFIER CIRCUIT 104

G3  GAIN OF FIRST ATTENUATION CIRCUIT 103 THROUGH SECOND ATTENUATION CIRCUIT 105 TO THIRD VARIABLE GAIN AMPLIFIER CIRCUIT 106

G4  GAIN OF VARIABLE GAIN AMPLIFIER 110

VARIABLE GAIN AMPLIFIER

BACKGROUND OF THE INVENTION

1. Field of the Invention

The present invention relates to a variable gain amplifier having a low NF (noise figure), used for a front-end of a receiving apparatus.

2. Description of the Related Art

A configuration of a conventional variable gain amplifier is shown in FIG. 9. A variable gain amplifier 110 is provided with a plurality of variable gain amplifier circuits called a first variable gain amplifier circuit 102, a second variable gain amplifier circuit 104, and a third variable gain amplifier circuit 106, a plurality of attenuation circuits called a first attenuation circuit 103 and a second attenuation circuit 105, and a gain control section 108.

An input of the first variable gain amplifier circuit 102 is connected to an RF input terminal 1 and an output thereof is connected to an RF output terminal 6. An input of the second variable gain amplifier circuit 104 is connected to the RF input terminal 1 through the first attenuation circuit 103 and an output thereof is connected to the RF output terminal 6. An input of the third variable gain amplifier circuit 106 is connected to the input of the second variable gain amplifier circuit 104 through the second attenuation circuit 105 and an output thereof is connected to the RF output terminal 6.

The gain control section 108 varies a gain of the first variable gain amplifier circuit 102, a gain of the second variable gain amplifier circuit 104, and a gain of the third variable gain amplifier circuit 106 according to a gain control voltage inputted into a gain control voltage input terminal 7.

In order to vary the gain of the variable gain amplifier circuit, means for varying a bias current of the variable gain amplifier circuit is often used.

Next, an operation of the variable gain amplifier 110 will be described using FIG. 10. FIG. 10 shows the gain of each signal path within the variable gain amplifier 110 versus the gain control voltage. Symbol G1 indicates the gain of the signal path in which the RF signal inputted into the RF input terminal 1 is amplified by the first variable gain amplifier circuit 102 and is subsequently outputted to the RF output terminal 6. Symbol G2 indicates the gain of the signal path in which the RF signal inputted into the RF input terminal 1 is attenuated by the first attenuation circuit 103 and is further amplified by the second variable gain amplifier circuit 104, and is subsequently outputted to the RF signal output terminal 6. Symbol G3 indicates the gain of the signal path in which the RF signal inputted into the RF input terminal 1 is attenuated by the first attenuation circuit 103, is further attenuated by the second attenuation circuit 105, and is further amplified by the third variable gain amplifier circuit 106, and is subsequently outputted to the RF signal output terminal 6. Symbol G4 indicates the gain of the variable gain amplifier 110.

When the gain of the variable gain amplifier 110 becomes the maximum, the gain control section 108 operates so that the gain of the first variable gain amplifier circuit 102 may become the maximum, the gain of the second variable gain amplifier circuit 104 may become the minimum, and the gain of the third variable gain amplifier circuit 106 may become the minimum. When the gain control voltage changes so that the gain of the variable gain amplifier 110 may be reduced, the gain control section 108 operates so that the gain of the first variable gain amplifier circuit 102 may be reduced first and the gain of the second variable gain amplifier circuit 104 may be increased. When the gain control voltage changes so that the gain of the variable gain amplifier 110 may be further reduced, the gain control section 108 operates so that the gain of the first variable gain amplifier circuit 102 may be further reduced, the gain of the second variable gain amplifier circuit 104 may change to be reduced after increasing to the maximum, and the gain of the third variable gain amplifier circuit 106 may be increased. When the gain of the variable gain amplifier 110 becomes the minimum, the gain of the first variable gain amplifier circuit 102 becomes the minimum, the gain of the second variable gain amplifier circuit 104 becomes the minimum, and the gain of the third variable gain amplifier circuit 106 becomes the maximum.

As the conventional variable gain amplifier, there has been a variable gain amplifier described in Japanese Unexamined Patent Publication (Kokai) No. 2003-60457. FIG. 11 shows a variable gain amplifier 117 described in the above-mentioned Japanese Unexamined Patent Publication (Kokai) No. 2003-60457. In FIG. 11, the same symbol is given to the same configuration as that shown in FIG. 9, and description thereof will be omitted. The variable gain amplifier 117 is provided with a plurality of variable gain amplifier circuits called a variable gain amplifier circuit 111, a variable gain amplifier circuit 112, and a variable gain amplifier circuit 113, whose maximum gains are different form each other. Respective variable gain amplifier circuits are inserted in parallel between the RF input terminal 1 and the RF output terminal 6.

A gain of the variable gain amplifier circuit 111 is varied by a gain control voltage and a bias current set in a current control circuit 116 according to the gain control voltage. A gain of the variable gain amplifier circuit 112 is varied by a voltage obtained by shifting the gain control voltage in a voltage shift circuit 114 by a predetermined voltage, and a bias current set by the current control circuit 116 according to the gain control voltage. A gain of the variable gain amplifier circuit 113 is varied by a voltage obtained by further shifting the voltage, which is obtained by shifting the gain control voltage in the voltage shift circuit 114 by the predetermined voltage, in a voltage shift circuit 115 by a predetermined voltage, and a bias current set by the current control circuit 116 according to the gain control voltage.

Next, an operation of the variable gain amplifier 117 will be described using FIG. 12. FIG. 12 shows the gain of each signal path within the variable gain amplifier 117 versus the gain control voltage. Symbol G1 indicates the gain of the signal path in which the RF signal inputted into the RF input terminal 1 is amplified by the variable gain amplifier circuit 111, and is subsequently outputted to the RF output terminal 6. Symbol G2 indicates the gain of the signal path in which the RF signal inputted into the RF input terminal 1 is amplified by the variable gain amplifier circuit 112, and is subsequently outputted to the RF output terminal 6. Symbol G3 indicates the gain of the signal path in which the RF signal inputted into the RF input terminal 1 is amplified by the variable gain amplifier circuit 113, and is subsequently outputted to the RF output terminal 6. Symbol G4 indicates the gain of the variable gain amplifier 117.

When the gain of the variable gain amplifier 117 becomes the maximum, the current control circuit 116 sets the bias current of the variable gain amplifier circuit 111 to be maximum and the bias currents of the variable gain amplifier circuits 112 and 113 to be minimum so that the gain of the variable gain amplifier circuit 111 may become the maximum, the gain of the variable gain amplifier circuit 112 may become the minimum, and the gain of the variable gain amplifier circuit 113 may become the minimum.

When the gain control voltage changes so that the gain of the variable gain amplifier 117 may be reduced, the current control circuit 116 sets the bias current of the variable gain amplifier circuit 111 to be reduced and the bias current of the variable gain amplifier circuit 112 to be increased so that the gain of the variable gain amplifier circuit 111 may be reduced first and the gain of the variable gain amplifier circuit 112 may be increased.

Further, when the gain control voltage changes so that the gain of the variable gain amplifier 117 may be reduced, the current control circuit 116 sets the bias current of the variable gain amplifier circuit 111 to be further reduced, the bias current of the variable gain amplifier circuit 112 to be changed to be reduced after increasing to the maximum, and the bias current of the variable gain amplifier circuit 113 to be increased so that the gain of the variable gain amplifier circuit 111 may be further reduced, the gain of the variable gain amplifier circuit 112 may change to be reduced after increasing to the maximum, and the gain of the variable gain amplifier circuit 113 may be increased.

Further, when the gain control voltage changes so that the gain of the variable gain amplifier 117 may be reduced, the current control circuit 116 sets the bias current of the variable gain amplifier circuit 111 to be further reduced, the bias current of the variable gain amplifier circuit 112 to be further reduced, and the bias current of the variable gain amplifier circuit 113 to be changed to be reduced after increasing to the maximum so that the gain of the variable gain amplifier circuit 111 may be further reduced, the gain of the variable gain amplifier circuit 112 may be further reduced, and the gain of the variable gain amplifier circuit 113 may be reduced after increasing to the maximum.

In the above-mentioned conventional variable gain amplifier 110, however, when a wide gain variable range is intended to be taken, there has been a problem that a circuit scale including the control circuit has been increased when securing an excellent linearity.

As described above, respective variable gain amplifier circuits 111 through 113 composing the variable gain amplifier 110 control the gains by controlling the bias currents in many cases, but since the gains of the variable gain amplifier circuits 111 through 113 are reduced, linearities of the variable gain amplifier circuits 111 through 113 deteriorate when reducing the bias currents of the variable gain amplifier circuits.

When large attenuation amounts of the first attenuation circuit 103 and the second attenuation circuit 105 are taken in order to take the wide gain variable range of the variable gain amplifier 110, a ratio for the output of the first variable gain amplifier circuit 102 to contribute to the RF output of the variable gain amplifier 110 becomes higher than a ratio for the output of the second variable gain amplifier circuit 104 to contribute to the RF output of the variable gain amplifier 110 or a ratio for the output of the third variable gain amplifier circuit 106 to contribute to the RF output of the variable gain amplifier 110, even in a situation where, for example, the bias current of the first variable gain amplifier circuit 102 is reduced, the gain thereof is decreased, and the linearity is deteriorated, and thus the linearity of the variable gain amplifier 110 will deteriorate. In order to suppress the deterioration of the linearity and to extend the gain variable range of the variable gain amplifier 110, it is necessary to increase the variable gain amplifier circuits in the number of stages, resulting in a large circuit scale.

Also in a case of the variable gain amplifier 117, when large maximum gain differences among the variable gain amplifier circuit 111, the variable gain amplifier circuit 112, and the variable gain amplifier circuit 113 are taken in order to take the wide gain variable range of the variable gain amplifier 117, the linearity of the variable gain amplifier 117 will deteriorate. In order to suppress the deterioration of the linearity and to extend the gain variable range of the variable gain amplifier 117, it is necessary to increase the variable gain amplifier circuits in the number of stages, resulting in a large circuit scale

DISCLOSURE OF THE INVENTION

Therefore, it is an object of the present invention to provide a variable gain amplifier having a wide gain variable range and having a small circuit scale.

It is another object of the present invention to provide a variable gain amplifier having a low NF.

It is still another object of the present invention is to provide a variable gain amplifier having an excellent linearity.

A variable gain amplifier of the present invention is provided with a first variable gain amplifier circuit which connects an input thereof to an input terminal of the variable gain amplifier and connects an output thereof to an output terminal of the variable gain amplifier, an attenuation circuit which connects one terminal thereof to the input terminal of the variable gain amplifier, a second variable gain amplifier circuit which connects an input thereof to the other terminal of the attenuation circuit and connects an output thereof to the output terminal of the variable gain amplifier, a first variable resistance circuit which connects one terminal thereof to a node between the attenuation circuit and the second variable gain amplifier circuit and grounds the other terminal, and a gain control section which varies a gain of the first variable gain amplifier circuit, a gain of the second variable gain amplifier circuit, and a resistance value of the first variable resistance circuit with a gain control voltage.

According to this configuration, when maximizing a gain of the variable gain amplifier, the gain of the first variable gain amplifier circuit is maximized, the gain of the second variable gain amplifier circuit is minimized, and the resistance value of the first variable resistance circuit is maximized, so that a loss between the input terminal of the variable gain amplifier and the input of the first variable gain amplifier circuit can be reduced. Hence, it is possible to achieve a variable gain amplifier having the low NF.

In addition, when minimizing the gain of the variable gain amplifier, the gain of the first variable gain amplifier circuit is minimized, the gain of the second variable gain amplifier circuit is maximized, and the resistance value of the first variable resistance circuit is minimized, so that a high attenuation amount resulting from a voltage-division between the attenuation circuit and the first variable resistance circuit occurs, thus allowing the gain of the variable gain amplifier to be reduced by this attenuation amount. As a result of this, the variable gain amplifier can have the wide gain variable range.

Consequently, it is possible to provide the variable gain amplifier composed of the variable gain amplifier circuits in a small number of stages, having the small circuit scale, having the wide gain variable range, and having the low NF.

Here, a point that the circuit scale is reduced by adding the first variable resistance circuit thereto to thereby reduce the number of variable gain amplifier circuits will be described. A conventional example in FIG. 9 shows an example where there are the variable gain amplifier circuits in three stages, but when a characteristic equivalent to that of present invention is intended to be obtained, the variable gain amplifier circuits in more number of stages, such as four stages or five stages will be required. In addition, regarding the variable gain amplifier circuit, in order to control and adjust a bias current to each of the variable gain amplifier circuits, a circuit, such as a differential pair and a current mirror, is needed.

Incidentally, there is a method disclosed in Japanese Unexamined Patent Publication (Kokai) No. 2005-117469 as a method of simply composing the differential pair comparatively. When these control circuits are included, since a plurality of variable gain amplifier circuits can be reduced, thereby making it possible to reduce the circuit scale.

In a configuration according to the aforementioned invention, it is preferable that when maximizing the gain of the variable gain amplifier, the gain of the first variable gain amplifier circuit is maximized, the gain of the second variable gain amplifier circuit is minimized, and the resistance value of the first variable resistance circuit is maximized, when minimizing the gain of the variable gain amplifier, the gain of the first variable gain amplifier circuit is minimized, the gain of the second variable gain amplifier circuit is maximized, and the resistance value of the first variable resistance circuit is minimized, when reducing the gain of the variable gain amplifier, the resistance value of the first variable resistance circuit is maintained at a high value while the gain of the first variable gain amplifier circuit is high compared with the gain of the second variable gain amplifier circuit, and after the gain of the first variable gain amplifier circuit is reduced and the gain of the second variable gain amplifier circuit is increased, and a ratio for the output of the second variable gain amplifier circuit to contribute to an output of the variable gain amplifier becomes large compared with a ratio for the output of the first variable gain amplifier circuit to contribute to the output of the variable gain amplifier, the gain control section operates so that the resistance value of the first variable resistance circuit may be decreased.

According to this configuration, the gain of the first variable gain amplifier circuit can be increased in a state where the ratio for the output of the second variable gain amplifier circuit to contribute to the output of the variable gain amplifier is higher than the ratio for the output of the first variable gain amplifier circuit to contribute to the output of the variable gain amplifier, as compared with a case where the attenuation amount of the attenuation circuit is increased in order to extend the gain variable range of the variable gain amplifier. At this time, since the bias current of the first variable gain amplifier circuit is large, a nonlinear distortion generated in the first variable gain amplifier circuit can be suppressed, so that a nonlinear distortion included in the output of the variable gain amplifier can be reduced. Meanwhile, when the resistance value of the first variable resistance circuit becomes the minimum, the high attenuation amount resulting from a voltage-division between the attenuation circuit and the first variable resistance circuit occurs, and the gain of the variable gain amplifier can be reduced by this attenuation amount, so that the variable gain amplifier can have the wide gain variable range. Moreover, since the loss between the input terminal of the variable gain amplifier and the input of the first variable gain amplifier circuit can be reduced when the gain of the variable gain amplifier becomes the maximum, it is possible to achieve a variable gain amplifier having the low NF. Consequently, it is possible to provide the variable gain amplifier composed of variable gain amplifier circuits in the small number of stages, having the small circuit scale, having the wide gain variable range, having the excellent linearity, and having the low NF.

In the configuration according to the aforementioned invention, it may be further provided with a second variable resistance circuit which connects one terminal thereof to the input terminal of the variable gain amplifier, and grounds the other terminal, wherein the gain control section may vary a resistance value of the second variable resistance circuit with the gain control voltage.

According to this configuration, when maximizing the gain of the variable gain amplifier, the gain of the first variable gain amplifier circuit is maximized, the gain of the second variable gain amplifier circuit is minimized, and the resistance values of the first variable resistance circuit and the second variable resistance circuit are maximized, so that the loss between the input terminal of the variable gain amplifier and the input of the first variable gain amplifier circuit can be reduced. Hence, it is possible to achieve the variable gain amplifier having the low NF.

Meanwhile, when minimizing the gain of the variable gain amplifier, the gain of the first variable gain amplifier circuit is minimized, the gain of the second variable gain amplifier circuit is maximized, and the resistance values of the first variable resistance circuit and the second variable resistance circuit are minimized, so that the high attenuation amount resulting from a voltage-division between the attenuation circuit and the first variable resistance circuit occurs, and the input of the first variable gain amplifier circuit voltage to an input power of the variable gain amplifier is reduced, so that the gain of the variable gain amplifier can be reduced. As a result of this, the variable gain amplifier can have the wide gain variable range and an allowable input power of the variable gain amplifier can be improved.

In addition, in the variable gain amplifier provided with the second variable resistance circuit, it is preferable that when maximizing the gain of the variable gain amplifier, the gain of the first variable gain amplifier circuit is maximized, the gain of the second variable gain amplifier circuit is minimized, and the resistance value of the first variable resistance circuit and the resistance value of the second variable resistance circuit are maximized, when minimizing the gain of the variable gain amplifier, the gain of the first variable gain amplifier circuit is minimized, the gain of the second variable gain amplifier circuit is maximized, and the resistance value of the first variable resistance circuit and the resistance value of the second variable resistance circuit are minimized, when reducing the gain of the variable gain amplifier, the resistance value of the second variable resistance circuit is decreased in a state where the gain of the first variable gain amplifier circuit is reduced and the gain of the second variable gain amplifier circuit is increased, and the resistance value of the first variable resistance circuit is maintained at a high value while the gain of the first variable gain amplifier circuit is high compared with the gain of the second variable gain amplifier circuit, and after the gain of the first variable gain amplifier circuit is reduced and the gain of the second variable gain amplifier circuit is increased, and the ratio for the output of the second variable gain amplifier circuit to contribute to the output of the variable gain amplifier becomes large compared with the ratio for the output of the first variable gain amplifier circuit to contribute to the output of the variable gain amplifier, the gain control section operates so that the resistance value of the first variable resistance circuit may be decreased.

According to this configuration, the gain of the first variable gain amplifier circuit can be increased in the state where the ratio for the output of the second variable gain amplifier circuit to contribute to the output of the variable gain amplifier is higher than the ratio for the output of the first variable gain amplifier circuit to contribute to the output of the variable gain amplifier, as compared with the case where the attenuation amount of the attenuation circuit is increased in order to extend the gain variable range of the variable gain amplifier. At this time, since the bias current of the first variable gain amplifier circuit is large, the nonlinear distortion generated in the first variable gain amplifier circuit can be suppressed, so that the nonlinear distortion included in the RF output of the variable gain amplifier can be reduced. In addition, when the resistance value of the second variable resistance circuit becomes the minimum, the high attenuation amount resulting from a voltage-division between the attenuation circuit and the second variable resistance circuit occurs, thus allowing the gain of the variable gain amplifier to be reduced by this attenuation amount. As a result of this, the variable gain amplifier can have the wide gain variable range. Moreover, since the loss between the input terminal of the variable gain amplifier and the input of the first variable gain amplifier circuit can be reduced when the gain of the variable gain amplifier becomes the maximum, it is possible to achieve the variable gain amplifier having the low NF. Further, while the gain variable range of the variable gain amplifier can be extended due to the change of the resistance value of the first variable resistance circuit, it is possible to prevent such a situation unsuitable to an automatic control of the variable gain amplifier that the gain of the variable gain amplifier is increased under a condition that the gain control section reduces the gain of the first variable gain amplifier circuit and increases the gain of the second variable gain amplifier circuit from occurring. Consequently, it is possible to provide the variable gain amplifier composed of the variable gain amplifier circuits in the small number of stages, having the small circuit scale, having the wide gain variable range, having the excellent linearity, having the low NF, and suitable for the automatic control of the gain.

In addition, preferably, the variable gain amplifier of the present invention is configured in such a way that a grounded source field-effect transistor is used as the first variable resistance circuit, a drain terminal of the field-effect transistor is used as one terminal of the first variable resistance circuit, and a source terminal of the field-effect transistor is grounded in a using frequency band, and has a configuration that one voltage between a variable resistance circuit control voltage generated in the gain control section according to the gain control voltage and a variable resistance circuit reference voltage internally generated in the gain control section is applied to a gate of the field-effect transistor and the other voltage is applied to a source of the field-effect transistor.

According to this configuration, by using the field-effect transistor suitable for the integration as the first variable resistance circuit, it is possible to provide the variable gain amplifier composed of the variable gain amplifier circuits in the small number of stages, having the small circuit scale, having the wide gain variable range, having the excellent linearity, having the low NF, suitable for the automatic control of the gain, and suitable for the integration.

Moreover, it is preferable that the variable gain amplifier of the present invention is configured in such a way that a plurality of grounded source field-effect transistors are used as the first variable resistance circuit, a drain terminal of each of the field-effect transistors is used as one terminal of the first variable resistance circuit, and a source terminal of each of the field-effect transistors is grounded in the using frequency band, and has a configuration that it comprises control voltage shifting means for supplying voltages obtained by shifting an inputted voltage by predetermined voltages, respectively, to respective gates of the field-effect transistors, one voltage between the variable resistance circuit control voltage generated in the gain control section according to the gain control voltage and the variable resistance circuit reference voltage internally generated in the gain control section is applied to the gate of the field-effect transistor through the control voltage shifting means, and the other voltage is applied to the source of the field-effect transistor.

According to this configuration, when the plurality of field-effect transistors are arranged in parallel in order to reduce the minimum resistance value of the first variable resistance circuit using the field-effect transistors, by shifting gate-source voltages Vgs of respective field-effect transistors to the gain control voltage inputted into the variable gain amplifier by predetermined voltages, the gate-source voltages Vgs of the plurality of field-effect transistors become threshold voltages in the specific gain control voltage, so that it is possible to prevent a high nonlinear distortion in the first and second variable resistance circuits from occurring. As a result of this, it is possible to provide the variable gain amplifier composed of the variable gain amplifier circuits in the small number of stages, having the small circuit scale, having the wide gain variable range, having the excellent linearity, having the low NF, suitable for the automatic control of the gain, and suitable for the integration.

Incidentally, it is possible to apply the same configuration as that of the first variable resistance circuit also to the second variable resistance circuit, and thus similar effect will be obtained.

Here, a point that the circuit scale can be reduced also when the plurality of field-effect transistors are used will be described. Since the plurality of field-effect transistors divide a size of a field-effect transistor originally needed, a physical size of the variable resistance circuit will never be extremely increased.

Further, a receiving apparatus of the present invention has a configuration in which the variable gain amplifier of the present invention is used as a low noise amplifier of a front-end.

According to this configuration, the receiving apparatus having an excellent receiving performance can be provided by arranging the variable gain amplifier having the wide gain variable range, having the excellent linearity, having the low NF, and suitable for a automatic control, as the low noise amplifier of the front-end of the receiving apparatus. Moreover, the receiving apparatus suitable for integration can be provided by arranging the variable gain amplifier suitable for the integration as the low noise amplifier of the front-end of the receiving apparatus.

As described above, according to the variable gain amplifier of the present invention, the variable gain amplifier composed of the variable gain amplifier circuits in the small number of stages has the wide gain variable range, has the excellent linearity, and can suppress the NF low.

DETAILED DESCRIPTION OF THE PREFERRED EMBODIMENTS

Hereinafter, embodiments of the present invention will be described with reference to the drawings.

First Embodiment

Figure 1:
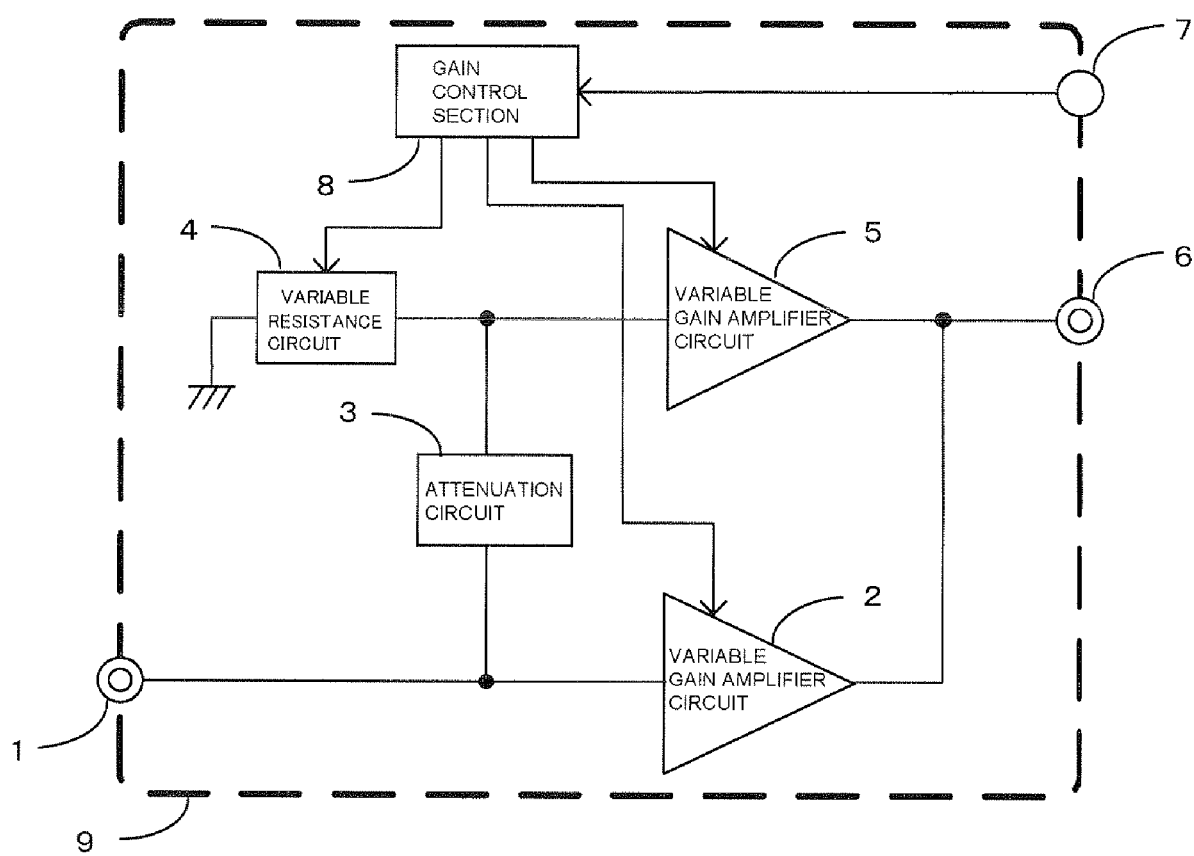
FIG. 1 is a block diagram illustrating a configuration of a variable gain amplifier according to a first embodiment of the present invention.
Figure 9:
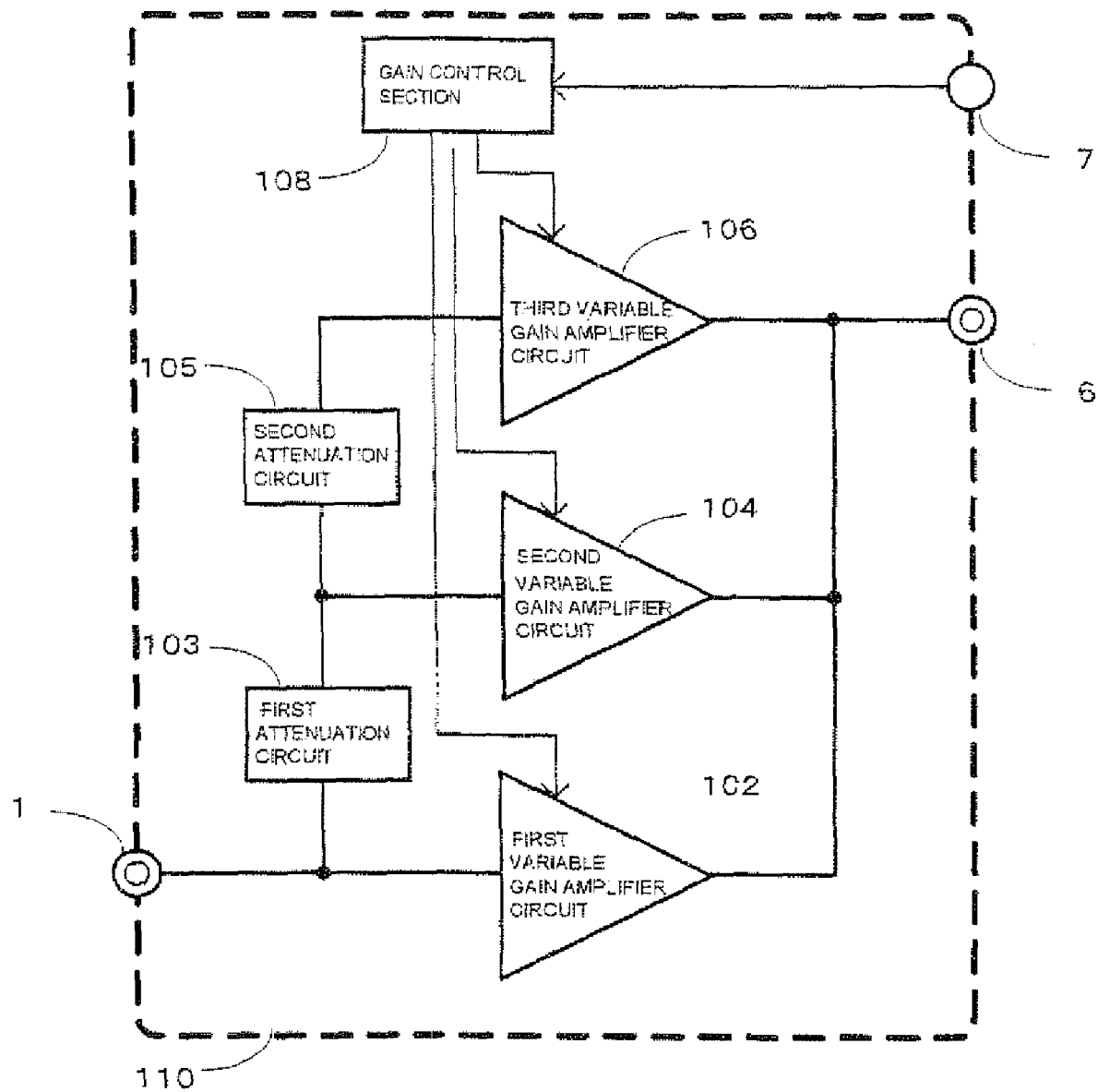
FIG. 9 is a block diagram illustrating a configuration of a conventional variable gain amplifier.
Figure 10:
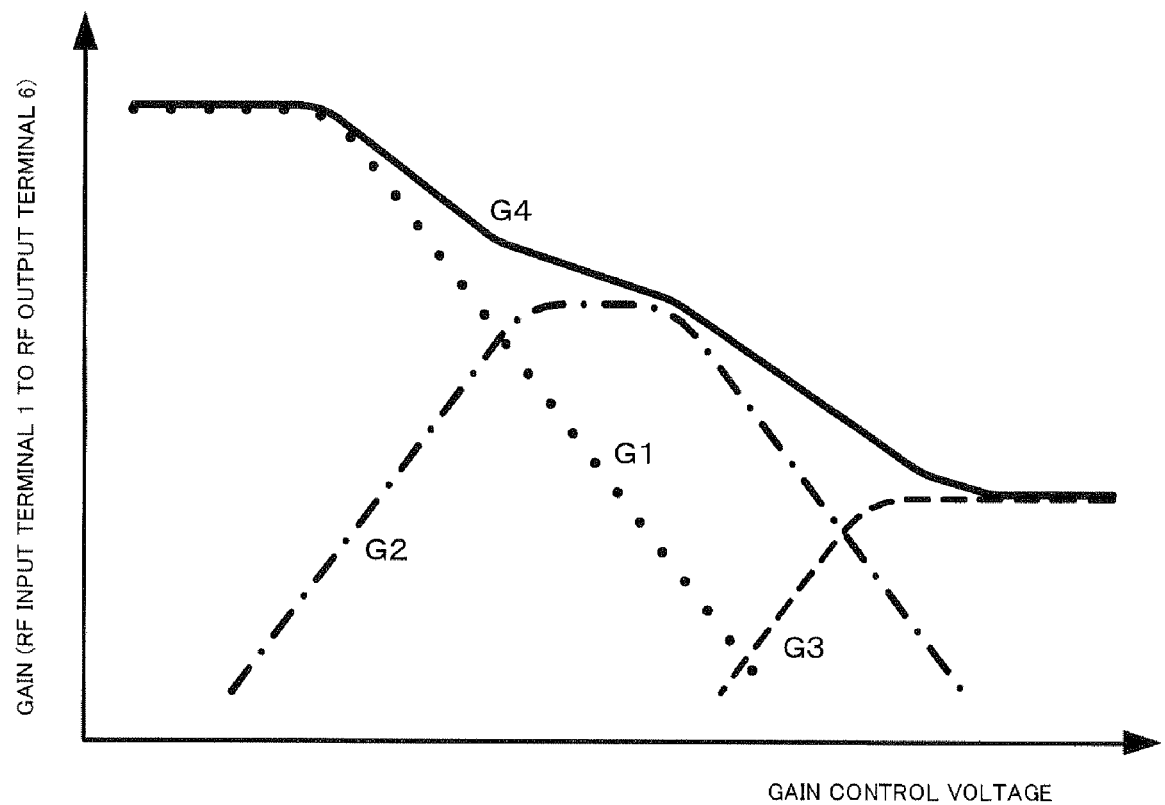
FIG. 10 is a characteristic view illustrating a characteristic of gain-gain control voltage of an internal signal path of the conventional variable gain amplifier.
Figure 11:
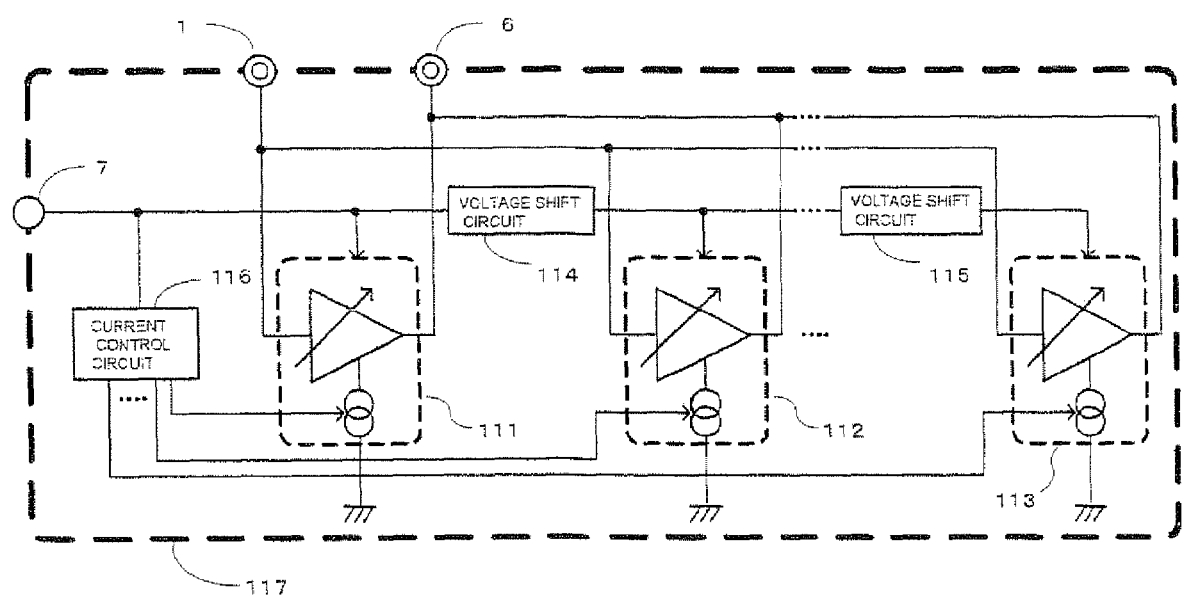
FIG. 11 is a block diagram illustrating a configuration of another conventional variable gain amplifier.
Figure 12:
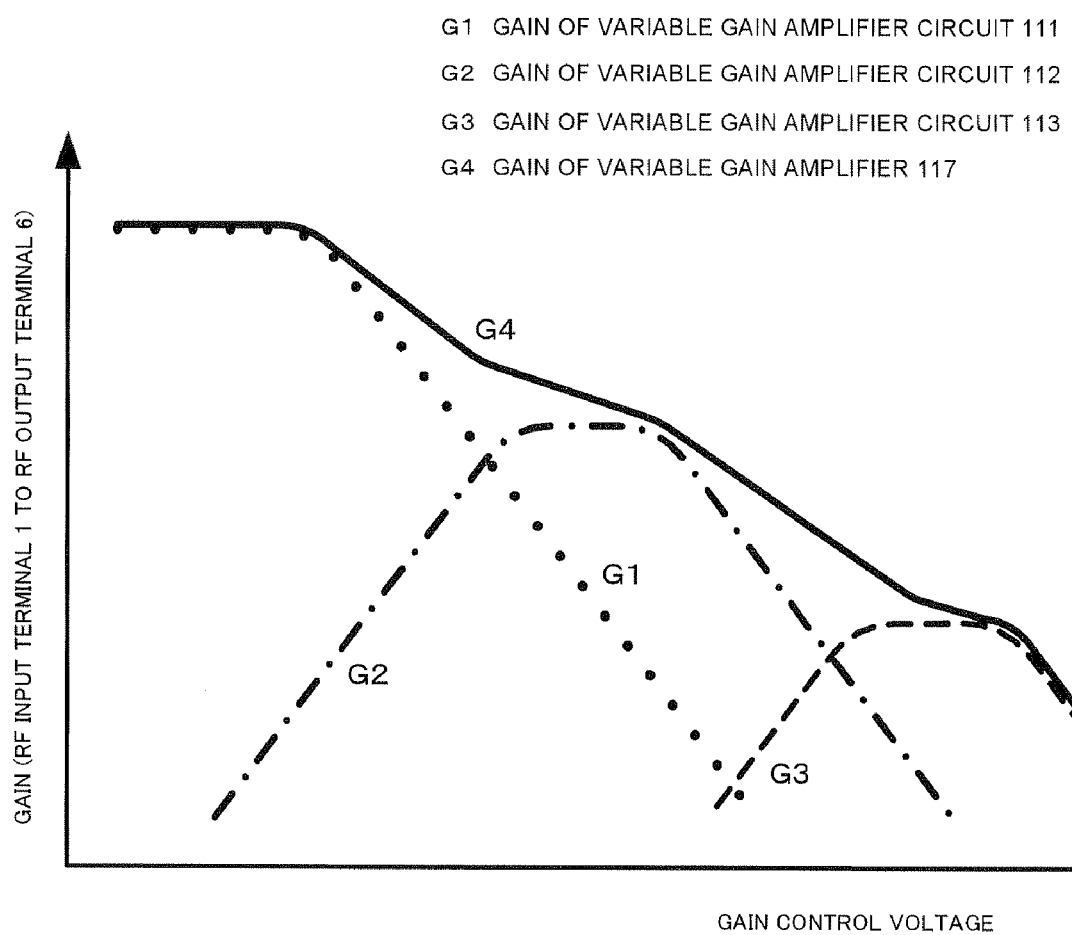
FIG. 12 is a characteristic view illustrating a characteristic of gain-gain control voltage of an internal signal path of another conventional variable gain amplifier.

FIG. 1 shows a block diagram of a variable gain amplifier in a first embodiment of the present invention. In FIG. 1, the same symbol is given to the same configuration as that shown in FIG. 9, and description thereof will be omitted.

A variable gain amplifier 9 is provided with a plurality of variable gain amplifier circuits called a variable gain amplifier circuit 2 and a variable gain amplifier circuit 5, an attenuation circuit 3, a variable resistance circuit 4, and a gain control section 8.

As for the variable gain amplifier circuit 2, an input thereof is connected to an RF input terminal 1, and an output thereof is connected to an RF output terminal 6. As for the variable gain amplifier circuit 5, an input thereof is connected to the RF input terminal 1 via an attenuation circuit 3, and an output thereof is connected to the RF output terminal 6. As for the variable resistance circuit 4, one terminal thereof is connected to a node between the attenuation circuit 3 and the variable gain amplifier circuit 5, and the other terminal thereof is grounded. The gain control section 8 then varies a gain of the variable gain amplifier circuit 2, a gain of the variable gain amplifier circuit 5, and a resistance value of the variable resistance circuit 4 according to a gain control voltage inputted from a gain control voltage input terminal 7, namely from the outside.

As the attenuation circuit 3, a small capacity capacitor for coupling and a resistance inserted in a signal line in series are suitable. As the variable gain amplifier circuits 2 and 5, a configuration in which a bias current of the amplifier circuit using a bipolar transistor and a field-effect transistor is varied to thereby vary the gain of the amplifier circuit is often used.

While the variable gain amplifier circuit 2 and the variable gain amplifier circuit 5 having the same characteristic may be used, those having different characteristics, such as the maximum gain, a gain variable range, power consumption, and a size may be used.

As means for increasing and decreasing the gain of the variable gain amplifier circuit according to the gain control voltage, means for, while using a differential pair, increasing and decreasing the bias current of the variable gain amplifier circuit by utilizing a change of a current flowing through the differential pair, or means for taking the gain control voltage by an AD conversion circuit to generate a voltage for setting the bias current of each variable gain amplifier circuit by processing a digital signal, and supplying it to each variable gain amplifier circuit via a DA conversion circuit may be used.

According to the present embodiment, when minimizing the gain of the variable gain amplifier 9, the gain of the variable gain amplifier circuit 2 is minimized and the resistance value of the variable resistance circuit 4 is minimized, so that a signal inputted into the variable gain amplifier 9 is voltage-divided by the attenuation circuit 3 and the variable resistance circuit 4, and is subsequently amplified by the variable gain amplifier circuit 5 to be outputted to the RF output terminal 6. For that reason, the minimum gain of the variable gain amplifier 9 can be suppressed low by obtaining a high attenuation amount resulting from the voltage-division between the attenuation circuit 3 and the variable resistance circuit 4, thereby making it possible for the variable gain amplifier 9 to have a wide gain variable range.

Further, when the gain of the variable gain amplifier 9 becomes the maximum, since the bias current is extremely low in order to minimize the gain of the variable gain amplifier circuit 5, an input impedance of the variable gain amplifier circuit 5 is high and the resistance value of the variable resistance circuit 4 is also the maximum, so that an impedance of the attenuation circuit 3 seen from the RF input terminal 1 becomes high. For that reason, a loss between the RF input terminal 1 and an input of the variable gain amplifier circuit 2 becomes low, and thus it is possible to reduce an NF (noise figure) of the variable gain amplifier 9.

Figure 2:
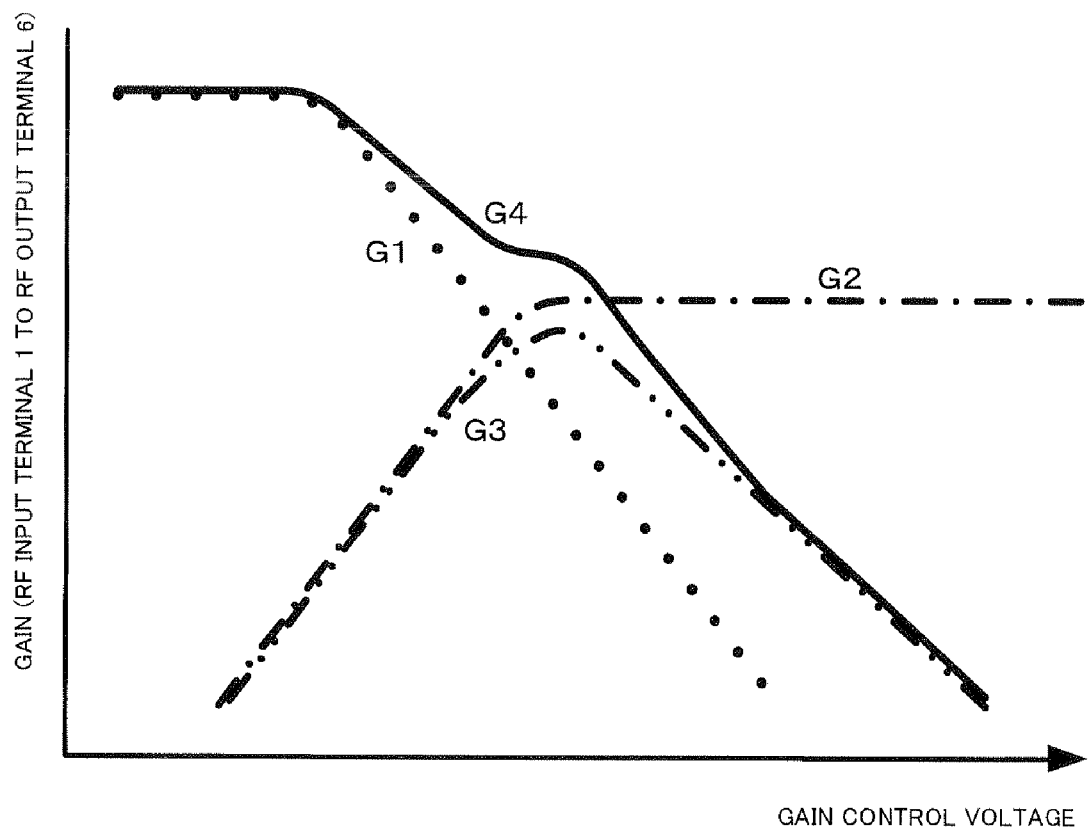
FIG. 2 is a characteristic view illustrating a characteristic of gain-gain control voltage of an internal signal path of the variable gain amplifier according to the first embodiment of the present invention.

FIG. 2 shows a gain of each signal path within the variable gain amplifier 9 versus the gain control voltage in order to describe a control operation of the variable gain amplifier in the first embodiment of the present invention. In FIG. 2, symbol G1 indicates the gain of the signal path in which the RF signal inputted into the RF input terminal 1 is amplified by the variable gain amplifier circuit 2 and is subsequently outputted to the RF output terminal 6. Symbol G2 indicates the gain of the signal path in which the RF signal inputted into the RF input terminal 1 is attenuated by the attenuation circuit 3 and is further amplified by the variable gain amplifier circuit 5, and is subsequently outputted to the RF signal output terminal 6. Symbol G3 indicates a characteristic when a characteristic of the variable resistance circuit 4 is added to a characteristic of symbol G2. Symbol G4 indicates a characteristic of the variable gain amplifier 9.

When the gain of the variable gain amplifier 9 becomes the maximum, the gain control section 8 operates so that the gain of the variable gain amplifier circuit 2 may become the maximum, the gain of the variable gain amplifier circuit 5 may become the minimum, and the resistance value of the variable resistance circuit 4 may become the maximum.

When the gain control voltage changes so that the gain of the variable gain amplifier 9 may be reduced, the gain control section 8 operates so that the gain of the variable gain amplifier circuit 2 may be reduced first and the gain of the variable gain amplifier circuit 5 may be increased. At this time, while the gain of the variable gain amplifier circuit 2 is higher than the gain of the variable gain amplifier circuit 5, the resistance value of the variable resistance circuit 4 is maintained at a large value. The gain control voltage further changes so that the gain of the variable gain amplifier 9 may be reduced, and from around a point of the gain control voltage where a ratio for an output of the variable gain amplifier circuit 5 to contribute to the RF output of the variable gain amplifier 9 is larger than a ratio for an output of the variable gain amplifier circuit 2 to contribute to the RF output of the variable gain amplifier 9, the gain control section 8 operates so that the resistance value of the variable resistance circuit 4 may be gradually reduced.

When the gain control voltage further changes so that the gain of the variable gain amplifier 9 may be reduced, the gain control section 8 operates so that the gain of the variable gain amplifier circuit 2 may be further reduced, the gain of the variable gain amplifier circuit 5 may become the maximum, and the resistance value of the variable resistance circuit 4 may become still lower. When the gain of the variable gain amplifier 9 becomes the minimum, the gain of the variable gain amplifier circuit 2 becomes the minimum, the gain of the variable gain amplifier circuit 5 becomes the maximum, and the resistance value of the variable resistance circuit 4 becomes the minimum.

Note herein that, in order to extend the gain variable range of the variable gain amplifier 9, it may be a configuration in which the gain control section 8 operates so that the variable gain amplifier circuit 5 may reduce again the gain of the variable gain amplifier circuit 5, which has once become the maximum according to the change of the gain control voltage, to a gain where a desired linearity can be satisfied.

A characteristic that the gain of the variable gain amplifier 9 is reduced along with an increase in the gain control voltage is shown in FIG. 2, but it may be a configuration in which the gain of the variable gain amplifier 9 is reduced along with a decrease in the gain control voltage.

According to the present embodiment, in a state where the ratio for the output of the variable gain amplifier circuit 5 to contribute to the RF output of the variable gain amplifier 9 is higher than the ratio for the output of the variable gain amplifier circuit 2 to contribute to the RF output of the variable gain amplifier 9, the gain of the variable gain amplifier circuit 2 can be increased, and since the bias current of the variable gain amplifier circuit 2 is large at this time, a nonlinear distortion generated in the variable gain amplifier circuit 2 can be suppressed, so that a nonlinear distortion included in the RF output of the variable gain amplifier 9 can be reduced.

Here, there will be described reasons that the gain of the variable gain amplifier circuit 2 can be increased in the state where the ratio for the output of the variable gain amplifier circuit 5 to contribute to the RF output of the variable gain amplifier 9 is higher than the ratio for the output of the variable gain amplifier circuit 2 to contribute to the RF output of the variable gain amplifier 9 as described above. There are two signal paths, namely, "the input through the variable gain amplifier circuit 2 to the output" and "the input through the attenuation circuit 3 via (the variable resistance circuit 4) to the variable gain amplifier circuit 5" in the RF output of the variable gain amplifier. Ratios for the signals passing through respective paths to contribute to the RF output of the variable gain amplifier 9 become equal, when Gain of the variable gain amplifier circuit 2=Gain of the variable gain amplifier circuit 5–Attenuation amount of the attenuation circuit (since the resistance value of the variable resistance circuit 4 is still large, there is no loss in the variable resistance circuit 4).

In the configuration of the embodiment of the present invention, since the attenuation amount of the attenuation circuit 3 is reduced, the ratio for the output of the variable gain amplifier circuit 5 to contribute to the RF output of the variable gain amplifier 9 is higher than the ratio for the output of the variable gain amplifier circuit 2 to contribute to the RF output of the variable gain amplifier 9 before the gain of the variable gain amplifier circuit 2 is greatly reduced.

Further, when the resistance value of the variable resistance circuit 4 becomes the minimum, the signal inputted into the variable gain amplifier 9 is voltage-divided by the attenuation circuit 3 and the variable resistance circuit 4, and is subsequently amplified by the variable gain amplifier circuit 5 to be outputted to the RF output terminal 6, so that the high attenuation amount resulting from a voltage-division between the attenuation circuit 3 and the variable resistance circuit 4 is obtained, thereby making it possible to suppress the minimum gain of the variable gain amplifier 9 low. As a result, the variable gain amplifier 9 can have the wide gain variable range.

Further, when the gain of the variable gain amplifier 9 becomes the maximum, since the bias current is extremely low in order to minimize the gain of the variable gain amplifier circuit 5, the input impedance of the variable gain amplifier circuit 5 is high, and since the resistance value of the variable resistance circuit 4 is also the maximum, the impedance of the attenuation circuit 3 seen from the RF input terminal 1 becomes high. For that reason, the loss between the RF input terminal 1 and the input of the variable gain amplifier circuit 2 becomes low, and thus it is possible to reduce the NF of the variable gain amplifier 9.

Additionally, the number of variable gain amplifier circuits can be decreased, and a circuit scale thereof can be reduced as compared with the conventional example. Here, a point allowing the circuit scale to be reduced will be described in more detail. While this embodiment reduces the circuit scale by providing the variable resistance circuit instead of the variable gain amplifier shown in the conventional example, reasons for allowing it to be reduced will be described below. When a linearity and a gain variable range equivalent to those of the present invention are intended to be secured in the conventional example, the variable gain amplifier circuit will be increased by about two stages in number for one variable resistance circuit, so that when considering that the control circuit is included, the reduction in circuit scale can be achieved in the configuration of the present invention as compare with the conventional example. For example, the configuration shown in FIG. 8 will provide the gain variable range not less than 50 dB. When the similar gain variable range is intended to be obtained using the conventional configuration while securing the linearity, the variable amplifier circuits composed of six stages are required.

As described above, according to the configuration of this embodiment, the variable gain amplifier composed of the variable gain amplifier circuits in a small number of stages has the wide gain variable range and has an excellent linearity by utilizing the variable resistance circuit, and thus making it possible to suppress the NF low.

Second Embodiment

Figure 3:
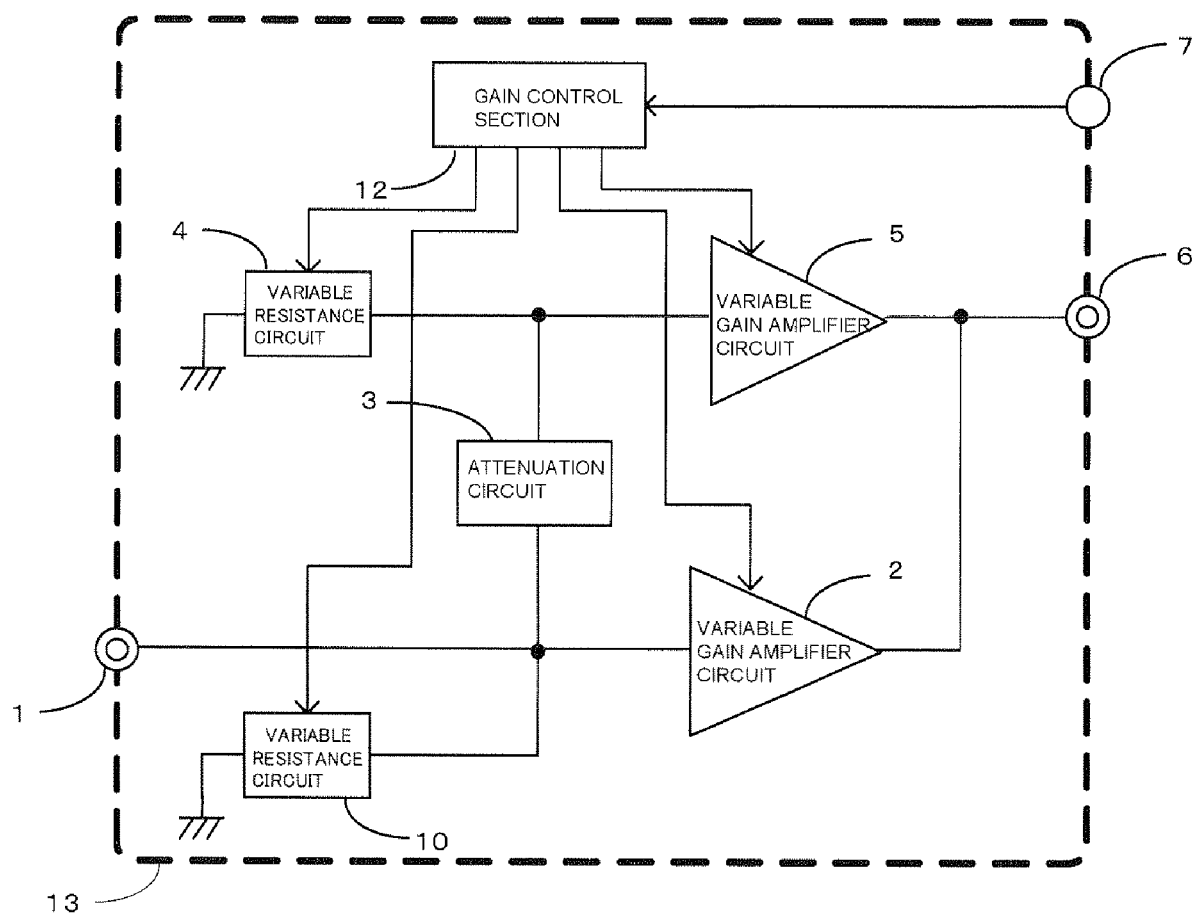
FIG. 3 is a block diagram illustrating a configuration of a variable gain amplifier according to a second embodiment of the present invention.

FIG. 3 shows a block diagram of a variable gain amplifier in a second embodiment of the present invention. In FIG. 3, the same symbol is given to the same configuration as that shown in FIG. 1, and description thereof will be omitted.

In addition to the configuration shown in FIG. 1, a variable gain amplifier 13 is provided with a variable resistance circuit 10, wherein one terminal thereof is connected to a node between the RF input terminal 1 and the input of the variable gain amplifier circuit 2, and the other terminal thereof is grounded.

A gain control section 12 varies the gain of the variable gain amplifier circuit 2, the gain of the variable gain amplifier circuit 5, a resistance value of the variable resistance circuit 10, and the resistance value of the variable resistance circuit 4 according to the gain control voltage. The variable resistance circuit 10 and the variable resistance circuit 4 may use the same configuration, and may use configurations in which the maximum resistance values and the minimum resistance values therebetween are different.

Figure 4:
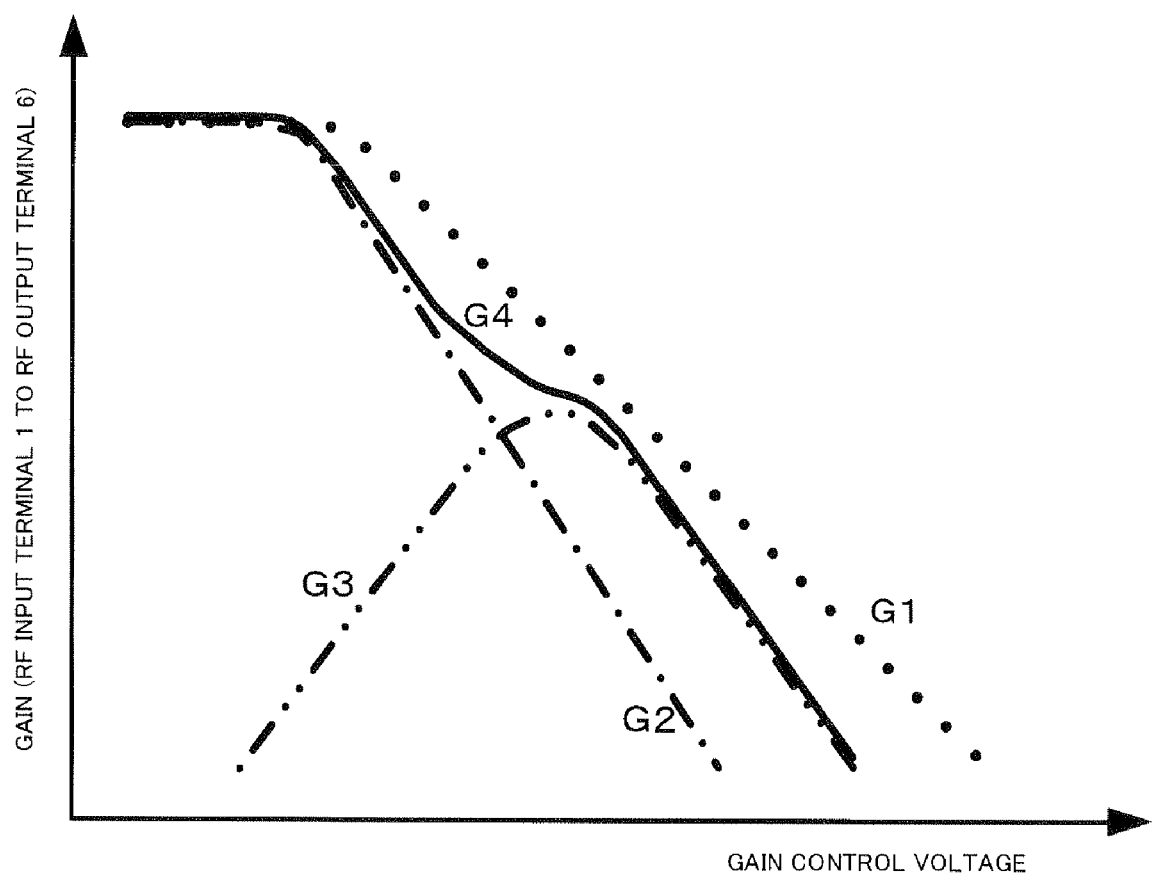
FIG. 4 is a characteristic view illustrating a characteristic of gain-gain control voltage of an internal signal path of the variable gain amplifier according to the second embodiment of the present invention.

Next, an operation of the variable gain amplifier 13 will be described using FIG. 4. FIG. 4 shows the gain of each signal path within the variable gain amplifier 13 versus the gain control voltage. In FIG. 4, symbol G1 indicates the gain of the signal path in which the RF signal inputted into the RF input terminal 1 is amplified by the variable gain amplifier circuit 2 and is subsequently outputted to the RF output terminal 6. Symbol G2 indicates a characteristic when a characteristic of the variable resistance circuit 10 is added to a characteristic of symbol G1. Symbol G3 indicates a characteristic when the characteristic of the variable resistance circuit 10 and the characteristic of the variable resistance circuit 4 are added to the gain of the signal path in which the RF signal inputted into the RF input terminal 1 is attenuated by the attenuation circuit 3 and is further amplified by the variable gain amplifier circuit 5, and is subsequently outputted to the RF output terminal 6. Symbol G4 indicates a characteristic of the variable gain amplifier 13.

When a gain of the variable gain amplifier 13 becomes the maximum, the gain control section 12 operates so that the gain of the variable gain amplifier circuit 2 may become the maximum, the gain of the variable gain amplifier circuit 5 may become the minimum, the resistance value of the variable resistance circuit 10 may become the maximum, and the resistance value of the variable resistance circuit 4 may become the maximum.

When the gain control voltage changes so that the gain of the variable gain amplifier 13 may be reduced, the gain control section 12 operates so that the gain of the variable gain amplifier circuit 2 may be reduced first, the gain of the variable gain amplifier circuit 5 may be increased, and the resistance value of the variable resistance circuit 10 may be decreased.

The gain control voltage further changes so that the gain of the variable gain amplifier 13 maybe reduced, and from around a point of the gain control voltage where the ratio for the output of the variable gain amplifier circuit 5 to contribute to the RF output of the variable gain amplifier 13 is larger than the ratio for the output of the variable gain amplifier circuit 2 to contribute to the RF output of the variable gain amplifier 13, the gain control section 12 operates so that the resistance value of the variable resistance circuit 4 may be gradually reduced.

When the gain control voltage further changes so that the gain of the variable gain amplifier 13 may be reduced, the gain control section 12 operates so that the gain of the variable gain amplifier circuit 2 may be further reduced, the gain of the variable gain amplifier circuit 5 may become the maximum, the resistance value of the variable resistance circuit 10 may become still lower, and the resistance value of the variable resistance circuit 4 may become still lower.

When the gain of the variable gain amplifier 13 becomes the minimum, the gain of the variable gain amplifier circuit 2 becomes the minimum, the gain of the variable gain amplifier circuit 5 becomes the maximum, the resistance value of the variable resistance circuit 10 becomes the minimum, and the resistance value of the variable resistance circuit 4 becomes the minimum.

Note herein that, in a relation between a gain control voltage at which the gain of the variable gain amplifier circuit 2, and the gain of the variable gain amplifier circuit 5 start increasing and decreasing, and a gain control voltage at which the resistance value of the variable resistance circuit 10 starts decreasing, those may be the same, the increase and decrease in the gain of the variable gain amplifier circuit 2 and the gain of the variable gain amplifier circuit 5 may begin first, or the decrease in the resistance value of the variable resistance circuit 10 may begin first.

Figure 5A:
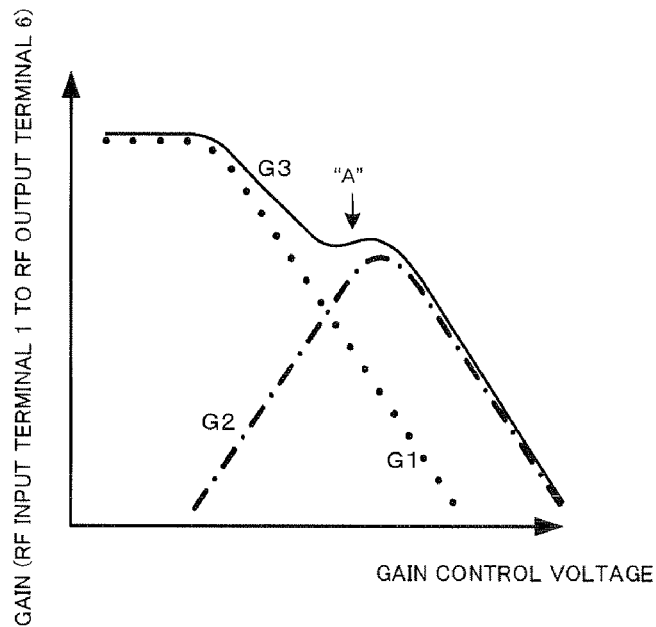
FIGS. 5A and 5B are characteristic views illustrating the characteristic of gain-gain control voltage of the internal signal path of the variable gain amplifier according to the second embodiment of the present invention.
Figure 5B:
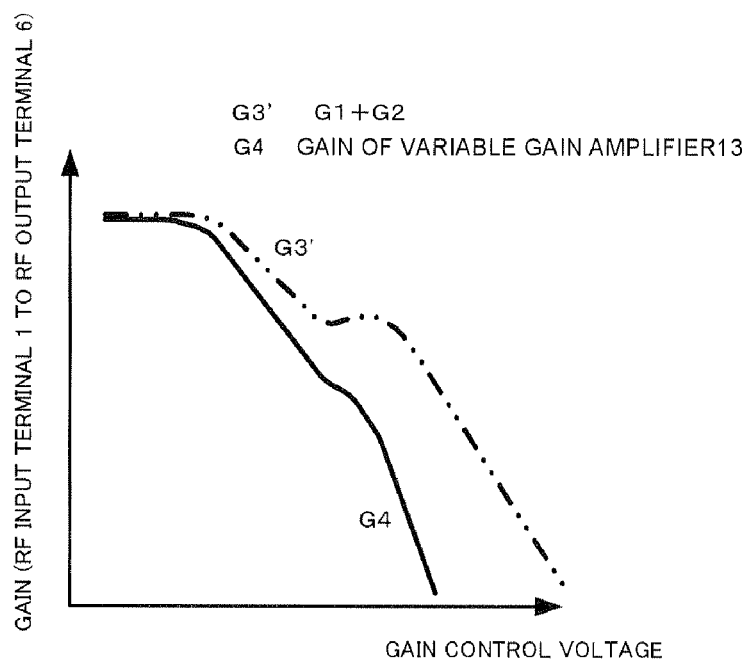

Further, an effect that can be expected from this embodiment will be described using FIGS. 5A and 5B. FIGS. 5A and 5B indicate the gain of each signal path within the variable gain amplifier 9 versus the gain control voltage, and the gain of each signal path within the variable gain amplifier 13 versus the gain control voltage. In FIGS. 5A and 5B, symbol G1 indicates the gain of the signal path in which the RF signal inputted into the RF input terminal 1 is amplified by the variable gain amplifier circuit 2 and is subsequently outputted to the RF output terminal 6. Symbol G2 indicates the characteristic when the characteristic of the variable resistance circuit 4 is added to the gain of the signal path in which the RF signal inputted into the RF input terminal 1 is attenuated by the attenuation circuit 3 and is further amplified by the variable gain amplifier circuit 5, and is subsequently outputted to the RF output terminal 6. Symbol G3 indicates the characteristic of the variable gain amplifier 9. Symbol G3' indicates a characteristic when removing the influence of the variable resistance circuit 10 from the gain of the variable gain amplifier 13. The characteristics of symbol G3 and symbol G3' are equal. Symbol G4 indicates the characteristic of the variable gain amplifier 13.

When the variable gain amplifier 9 is designed so that an influence for the increase in the gain of the variable gain amplifier circuit 5 to exert on the RF output of the variable gain amplifier 9 may become larger than an influence for the decrease in the gain of the variable gain amplifier circuit 2 to exert on the RF output of the variable gain amplifier 9 in a specific gain control voltage, there is indicated a characteristic as shown "A" in symbol G3, in which the gain of the variable gain amplifier 9 is increased while the gain control voltage is changing in a direction to reduce the gain of the variable gain amplifier 9. When the gain of the variable gain amplifier 9 is intended to be automatically controlled, such a characteristic will cause an inconvenience.

Meanwhile, in the variable gain amplifier 13 provided with the variable resistance circuit 10, a situation in which the gain of the variable gain amplifier 13 is increased when the gain control voltage changes in the direction to reduce the gain of the variable gain amplifier 13 can be prevented from occurring.

Hereinafter, this reason will be described. As a factor for causing aforementioned problems, there is a case where the ratio for the output of the variable gain amplifier circuit 5 to contribute to the RF output of the variable gain amplifier 13 is higher than the ratio for the output of the variable gain amplifier circuit 2 to contribute to the RF output of the variable gain amplifier 13 while the gain of the variable gain amplifier circuit 5 is increasing. This tends to be generated easily when the attenuation amount of the attenuation circuit is low. If it is designed such that a gain decrease due to the variable resistance circuit 10 may become larger than a gain increase of the variable gain amplifier circuit 5 at this time, the variable gain amplifier 13 can prevent the occurrence of the situation in which the gain of the variable gain amplifier 13 is increased when the gain control voltage changes in the direction to reduce the gain of the variable gain amplifier 13.

According to the present embodiment, when the resistance value of the variable resistance circuit 10 becomes low, the input impedance of the variable gain amplifier 13 is reduced by providing the variable resistance circuit 10, so that the gain of the variable gain amplifier 13 can be reduced. As a result of this, a gain variable range of the variable gain amplifier 13 can be expanded.

Additionally, since the gain of the variable gain amplifier 13 is increased and decreased according to the direction in which the gain control voltage changes, the variable gain amplifier 13 suitable for an automatic control of the gain can be provided.

Third Embodiment

Figure 6:
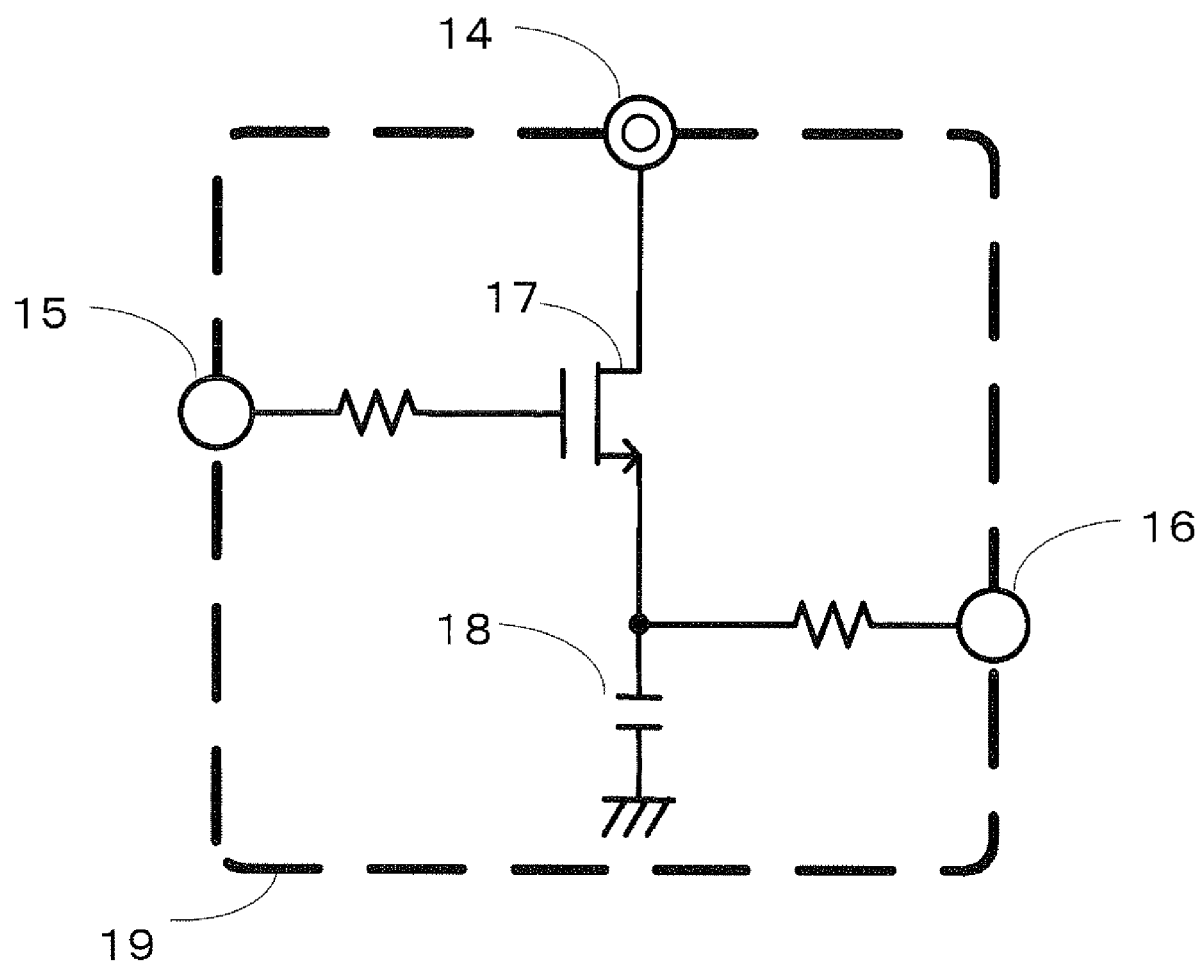
FIG. 6 is a circuit diagram illustrating a configuration of a variable resistance circuit used for a variable gain amplifier according to a third embodiment of the present invention.

FIG. 6 is a circuit diagram of a variable resistance circuit 19 used for a variable gain amplifier of a third embodiment of the present invention. The variable resistance circuit 19 grounds a source of a field-effect transistor 17 by a capacitor 18 in an RF signal frequency, controls a gate-source voltage Vgs which is a difference between a voltage inputted into a voltage input terminal 15 and a voltage inputted into a voltage input terminal 16, and varies a resistance value of the variable resistance circuit 19 seen from an RF connecting terminal 14 in the RF signal frequency. A variable resistance circuit reference voltage is inputted into one terminal of the voltage input terminal 15 and the voltage input terminal 16, and a variable resistance circuit control voltage which changes according to the gain control voltage is inputted into the other terminal.

The variable resistance circuit reference voltage may be generated by a resistance-division of a supply voltage applied to the variable gain amplifier, or maybe set by a logic section. The variable resistance circuit control voltage may be generated by a resistance-division of the gain control voltage, or may be generated in such a way that the gain control voltage is taken by an AD conversion circuit to be converted into a suitable value by signal processing and is outputted via the DA conversion circuit. Additionally, a configuration in which the source of the field-effect transistor 17 is directly grounded and the variable resistance circuit control voltage is inputted into the voltage input terminal 15 to control the resistance value of the variable resistance circuit 19 may be used.

According to the present embodiment, by composing the variable resistance circuit using a field-effect transistor suitable for integration, it is possible to provide the variable gain amplifier in which the variable resistance circuit has a configuration suitable for the integration.

Fourth Embodiment

Figure 7:
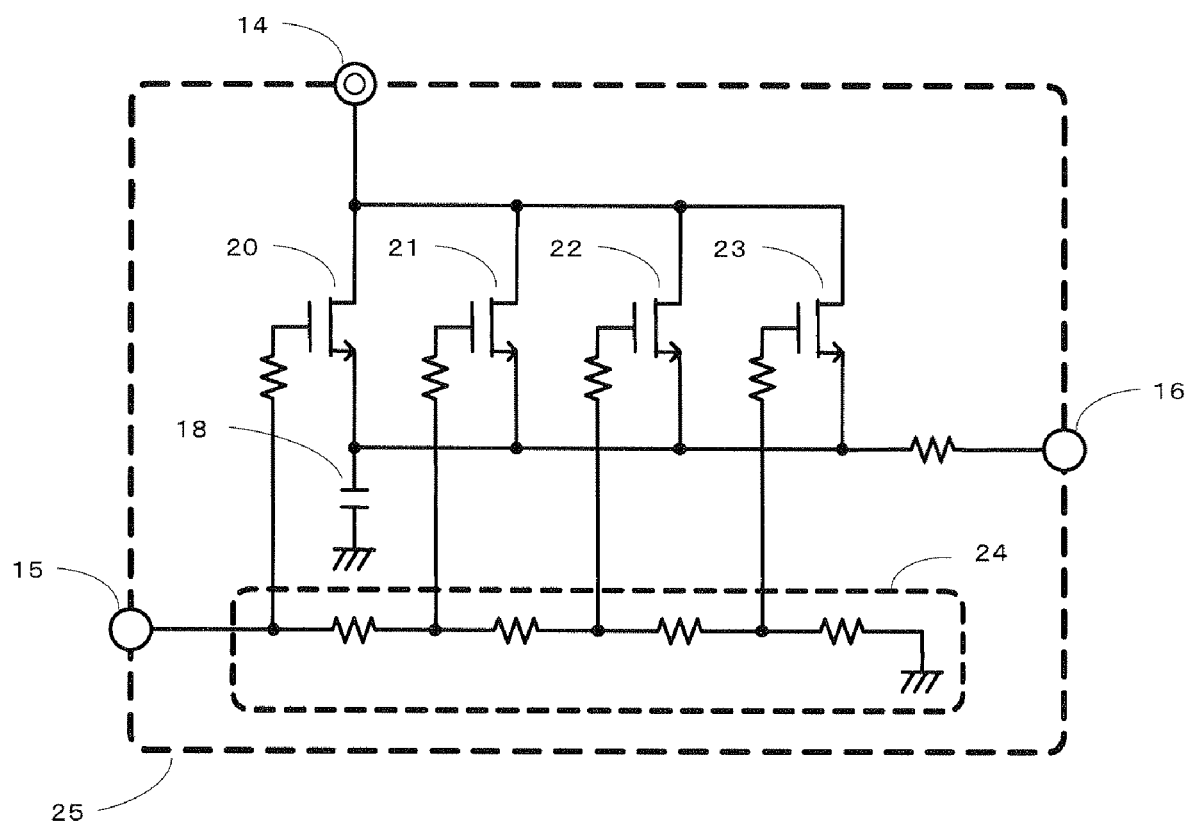
FIG. 7 is a circuit diagram illustrating a configuration of a variable resistance circuit used for a variable gain amplifier according to a fourth embodiment of the present invention.

FIG. 7 is a circuit diagram of a variable resistance circuit 25 used for a variable gain amplifier of a fourth embodiment of the present invention. In FIG. 7, the same symbol is given to the same configuration as that shown in FIG. 6, and description thereof will be omitted.

In this embodiment, a field-effect transistor 20, a field-effect transistor 21, a field-effect transistor 22, and a field-effect transistor 23 are connected in parallel, wherein a signal inputted into the voltage input terminal 15 is respectively shifted by control voltage shift means 24 by predetermined voltages and is applied to a gate of each field-effect transistor. There is no limit to the number of field-effect transistors to be used.

The control voltage shift means 24 may have a configuration of a resistance voltage-division, a configuration utilizing, for example, a voltage drop of a diode, or a configuration in which voltage values respectively shifted by predetermined voltages by the digital signal processing may be set based on a voltage value taken by the AD conversion circuit and be outputted via respective DA conversion circuits. The control voltage shift means 24 may shift the inputted voltage at equal step to thereby output the shifted voltages, or may shift it at different steps, respectively, to thereby output them.

According to the present embodiment, while the minimum resistance value of the variable resistance circuit 25 seen from the RF connecting terminal 14 in the RF signal frequency is reduced by providing the plurality of field-effect transistors in parallel, and the gate-source voltages Vgs of respective field-effect transistors can be set to different values by the control voltage shift means 24. For that reason, the gate-source voltages Vgs of the plurality of field-effect transistors become threshold voltages in the specific gain control voltage, so that it is possible to prevent a high nonlinear distortion in the variable resistance circuit 25 from occurring. As a result, it is possible to provide the variable gain amplifier having the excellent linearity and suitable for the integration.

Fifth Embodiment

Figure 8:
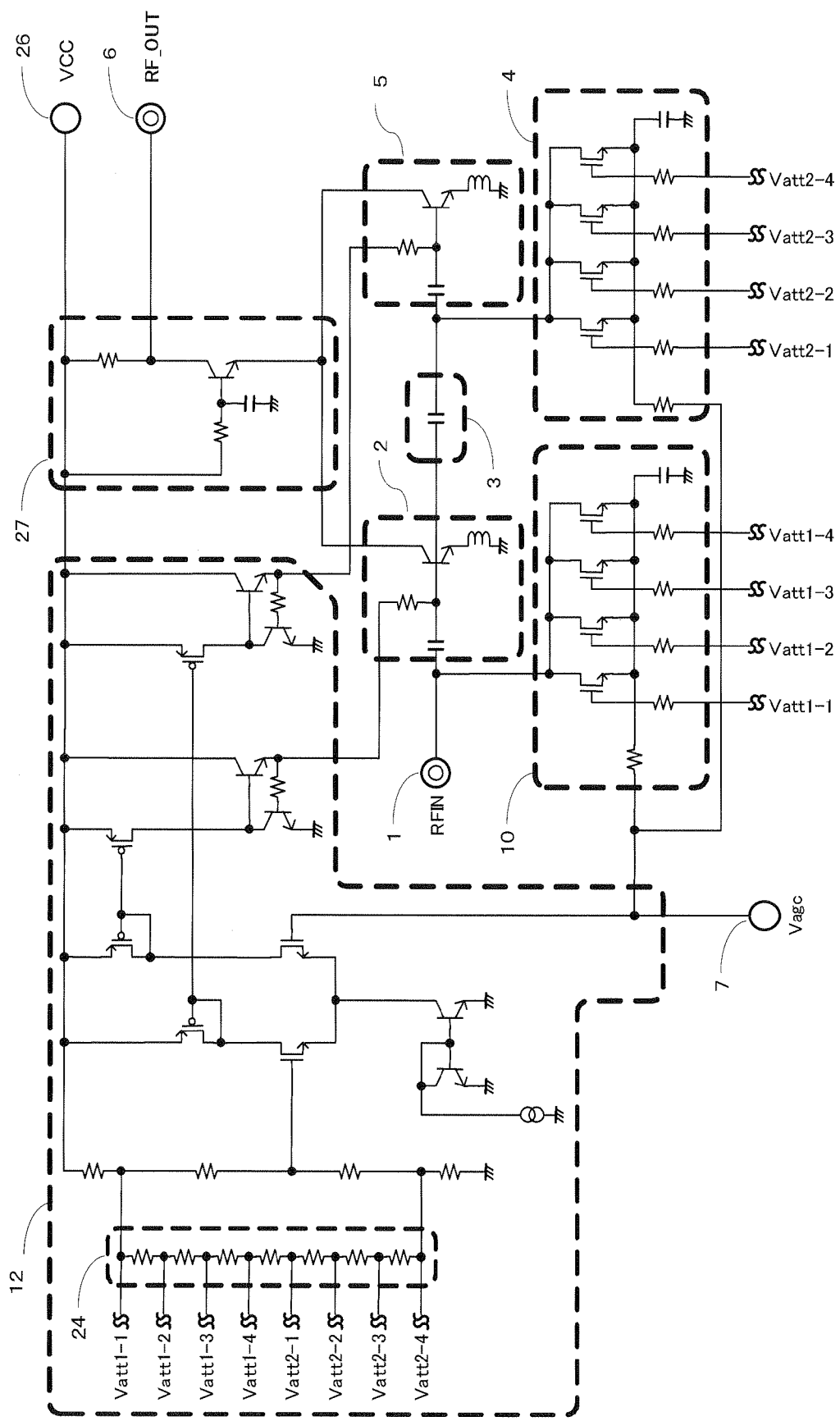
FIG. 8 is a circuit diagram illustrating a configuration of a variable gain amplifier according to a fifth embodiment of the present invention.

FIG. 8 shows a circuit diagram of a variable gain amplifier in a fifth embodiment of the present invention. In FIG. 8, the same symbol is given to the same configuration as that shown in FIG. 3, and description thereof will be omitted.

The variable gain amplifier circuit 2 and the variable gain amplifier circuit 5 set an increase and decrease of the gain by increasing and decreasing a bias current of a grounded emitter transistor. The variable gain amplifier circuit 2 and the variable gain amplifier circuit 5 may be the same, may use different transistors, or may have different circuit constants. It has a configuration in which a small capacity capacitor is arranged in a signal line in series as the attenuation circuit 3, and this capacitor also serves as DC cut.

The gain control section 12 has a differential pair for comparing a voltage obtained by a resistance-division of a supply voltage inputted into a supply voltage input terminal 26 with a gain control voltage Vagc applied to the gain control voltage input terminal 7, and varies a current flowing through the variable gain amplifier circuit 2 and a bias current flowing through the variable gain amplifier circuit 5 based on a change of a current flowing through the differential pair. It may be a configuration in which the bias currents of the variable gain amplifier circuit 2 and the variable gain amplifier circuit 5 may be varied using one set of differential pair, or a configuration in which they are provided with differential pairs, respectively, in order to vary the bias currents of respective variable gain amplifier circuits.

The control voltage shift means 24 resistance-divides the supply voltage to generate variable resistance circuit reference voltages Vatt1-1 through Vatt1-4 for the variable resistance circuit 10, and variable resistance circuit reference voltages Vatt2-1 through Vatt2-4 for the variable resistance circuit 4, and supplies them to gates of each of field-effect transistors. The grounded base transistor 27 is provided in order to suppress a fluctuation in output impedance of the variable gain amplifier of this configuration.

With this configuration, it is possible to achieve the variable gain amplifier in which the gain is reduced along with the decrease in the gain control voltage.

According to the present embodiment, a receiving apparatus having an excellent receiving performance can be provided by using the variable gain amplifier having the wide gain variable range, having the excellent linearity, having the low NF, and suitable for a automatic control of the gain as a low noise amplifier of a front-end. Moreover, the receiving apparatus in which a front-end section is integrated can be provided by using the variable gain amplifier suitable for the integration as the low noise amplifier of the front-end.

As described above, in the present invention, the first and second variable gain amplifier circuits are provided, and the variable resistance circuit which connects one terminal thereof to the node between the attenuation circuit and the second variable gain amplifier circuit and grounds the other terminal is provided, wherein when reducing the gain of the variable gain amplifier, while the gain of the first variable gain amplifier circuit other than the second variable gain amplifier circuit to which the variable resistance circuit is connected is high, the resistance value of the variable resistance circuit is maintained at a high value, and after the gain of the first variable gain amplifier circuit is reduced and the gain of the second variable gain amplifier circuit to which the variable resistance circuit is connected is increased, and the ratio for the output of the second variable gain amplifier circuit to which the variable resistance circuit is connected to contribute to the RF output of the variable gain amplifier became larger than the ratio for the output of the first variable gain amplifier circuit to contribute to the RF output of the variable gain amplifier, the control is performed so that the resistance value of the variable resistance circuit may be decreased. Since a large attenuation amount occurs due to the voltage-division between the attenuation circuit and the variable resistance circuit when the resistance value of the variable resistance circuit becomes the minimum, the gain of the variable gain amplifier can be reduced by this attenuation amount, so that the variable gain amplifier can have the wide gain variable range without increasing the attenuation amount of the attenuation circuit and without increasing the number of stages of the variable gain amplifier circuit. As a result of this, it is possible to provide the variable gain amplifier having the wide gain variable range, having the small circuit scale, and having the excellent linearity.

INDUSTRIAL APPLICABILITY

The variable gain amplifier in accordance with the present invention is composed of the variable gain amplifier circuits in the small number of stages, has features of the wide gain variable range, the excellent linearity, and the low NF, so that it is useful for applications, such as the low noise amplifier of the front-end of the receiving apparatus or the like.

What is claimed is:

1. A variable gain amplifier, comprising:
   a first variable gain amplifier circuit which connects an input thereof to an input terminal of the variable gain amplifier and connects an output thereof to an output terminal of the variable gain amplifier;
   an attenuation circuit which connects one terminal thereof to the input terminal of the variable gain amplifier;
   a second variable gain amplifier circuit which connects an input thereof to the other terminal of the attenuation circuit and connects an output thereof to the output terminal of the variable gain amplifier;
   a first variable resistance circuit which connects one terminal thereof to a node between the attenuation circuit and the second variable gain amplifier circuit and grounds the other terminal; and
   a gain control section which varies a gain of the first variable gain amplifier circuit, a gain of the second variable gain amplifier circuit, and a resistance value of the first variable resistance circuit with a gain control voltage.

2. The variable gain amplifier according to claim 1, wherein
   when maximizing a gain of the variable gain amplifier, the gain of the first variable gain amplifier circuit is maximized, the gain of the second variable gain amplifier circuit is minimized, and the resistance value of the first variable resistance circuit is maximized,
   when minimizing the gain of the variable gain amplifier, the gain of the first variable gain amplifier circuit is minimized, the gain of the second variable gain amplifier circuit is maximized, and the resistance value of the first variable resistance circuit is minimized,
   when reducing the gain of the variable gain amplifier, while the gain of the first variable gain amplifier circuit is higher than the gain of the second variable gain amplifier circuit, the resistance value of the first variable resistance circuit is maintained at a high value, and after the gain of the first variable gain amplifier circuit is reduced and the gain of the second variable gain amplifier circuit is increased, and a ratio for the output of the second variable gain amplifier circuit to contribute to an output of the variable gain amplifier becomes large compared with a ratio for the output of the first variable gain amplifier circuit to contribute to the output of the variable gain amplifier, the gain control section operates so that the resistance value of the first variable resistance circuit may be decreased.

3. The variable gain amplifier according to claim 1, further comprising a second variable resistance circuit which connects one terminal thereof to the input terminal of the variable gain amplifier, and grounds another terminal thereof, wherein the gain control section varies a resistance value of the second variable resistance circuit with the gain control voltage.

4. The variable gain amplifier according to claim 3, wherein
   when maximizing a gain of the variable gain amplifier, the gain of the first variable gain amplifier circuit is maximized, the gain of the second variable gain amplifier circuit is minimized, and the resistance value of the first variable resistance circuit and the resistance value of the second variable resistance circuit are maximized,
   when minimizing the gain of the variable gain amplifier, the gain of the first variable gain amplifier circuit is minimized, the gain of the second variable gain amplifier circuit is maximized, and the resistance value of the first variable resistance circuit and the resistance value of the second variable resistance circuit are minimized, and
   when reducing the gain of the variable gain amplifier, the resistance value of the second variable resistance circuit is decreased in a state where the gain of the first variable gain amplifier circuit is reduced and the gain of the second variable gain amplifier circuit is increased, and the resistance value of the first variable resistance circuit is maintained at a high value while the gain of the first variable gain amplifier circuit is high compared with the gain of the second variable gain amplifier circuit, and after the gain of the first variable gain amplifier circuit is reduced and the gain of the second variable gain amplifier circuit is increased, and a ratio for the output of the second variable gain amplifier circuit to contribute to an output of the variable gain amplifier becomes large compared with a ratio for the output of the first variable gain amplifier circuit to contribute to the output of the variable gain amplifier, the gain control section operates so that the resistance value of the first variable resistance circuit may be decreased.

5. The variable gain amplifier according to claim 1, wherein it is configured in such a way that a grounded source field-effect transistor is used as the first variable resistance circuit, a drain terminal of the field-effect transistor is used as one terminal of the first variable resistance circuit, and a source terminal of the field-effect transistor is grounded in a using frequency band, and wherein one voltage between a variable resistance circuit control voltage generated in the gain control section according to the gain control voltage and a variable resistance circuit reference voltage internally generated in the gain control section is applied to a gate of the field-effect transistor and another voltage is applied to a source of the field-effect transistor.

6. The variable gain amplifier according to claim 3, wherein it is configured in such a way that a grounded source field-effect transistor is used as the first and the second variable resistance circuits, a drain terminal of the field-effect transistor is used as one terminal of the first and second variable resistance circuits, respectively, and a source terminal of the field-effect transistor is grounded in a using frequency band, and wherein one voltage between a variable resistance circuit control voltage generated in the gain control section according to the gain control voltage and a variable resistance circuit reference voltage internally generated in the gain control section is applied to a gate of the field-effect transistor and another voltage is applied to a source of the field-effect transistor.

7. The variable gain amplifier according to claim 1, wherein it is configured in such a way that a plurality of grounded source field-effect transistors are used as the first variable resistance circuit, a drain terminal of each of the field-effect transistors is used as one terminal of the first variable resistance circuit, and a source terminal of each of the field-effect transistors is grounded in a using frequency band, wherein it comprises control voltage shifting means for supplying voltages obtained by shifting an inputted voltage by predetermined voltages, respectively, to respective gates of the field-effect transistors, and wherein one voltage between a variable resistance circuit control voltage generated in the gain control section according to the gain control voltage and a variable resistance circuit reference voltage internally generated in the gain control section is applied to the gate of the field-effect transistor through the control voltage shifting means, and another voltage is applied to the source of the field-effect transistor.

8. The variable gain amplifier according to claim 3, wherein it is configured in such a way that a plurality of grounded source field-effect transistors are used as the first and second variable resistance circuits, a drain terminal of each of the field-effect transistors is used as one terminal of the first and second variable resistance circuits, respectively, and a source terminal of each of the field-effect transistors is grounded in a using frequency band, wherein it comprises control voltage shifting means for supplying voltages obtained by shifting an inputted voltage by predetermined voltages, respectively, to respective gates of the field-effect transistors, and wherein one voltage between a variable resistance circuit control voltage generated in the gain control section according to the gain control voltage and a variable resistance circuit reference voltage internally generated in the gain control section is applied to the gate of the field-effect transistor through the control voltage shifting means, and another voltage is applied to the source of the field-effect transistor.

9. A receiving apparatus for using the variable gain amplifier according to claim 1 as a low noise amplifier of a front-end.

10. A receiving apparatus for using the variable gain amplifier according to claim 3 as a low noise amplifier of a front-end.

* * * * *